(12) United States Patent
Hack et al.

(10) Patent No.: US 8,263,902 B2
(45) Date of Patent: Sep. 11, 2012

(54) LASER-SCRIBING SYSTEM FOR STRUCTURING SUBSTRATES FOR THIN LAYER SOLAR MODULES

(76) Inventors: Rüdiger Hack, Starnberg (DE); Peter Feraric', Neubiberg (DE)

( * ) Notice: Subject to any disclaimer, the term of this patent is extended or adjusted under 35 U.S.C. 154(b) by 0 days.

(21) Appl. No.: 13/003,343

(22) PCT Filed: Jul. 14, 2009

(86) PCT No.: PCT/DE2009/000985
§ 371 (c)(1),
(2), (4) Date: Jan. 10, 2011

(87) PCT Pub. No.: WO2010/006589
PCT Pub. Date: Jan. 21, 2010

(65) Prior Publication Data
US 2011/0111576 A1    May 12, 2011

(30) Foreign Application Priority Data

Jul. 17, 2008 (DE) .......................... 10 2008 033 610

(51) Int. Cl.
*B23K 26/00* (2006.01)
(52) U.S. Cl. ......... 219/121.69; 219/121.68; 219/121.82; 219/121.83
(58) Field of Classification Search .................. 438/462; 219/121.68, 121.69, 121.82, 121.83
See application file for complete search history.

(56) References Cited

U.S. PATENT DOCUMENTS

| | | | |
|---|---|---|---|
| 3,816,700 A * | 6/1974 | Weiner et al. | 219/121.68 |
| 6,559,411 B2 | 5/2003 | Borgeson et al. | |
| 2004/0036848 A1* | 2/2004 | Frissen et al. | 355/53 |
| 2008/0263877 A1 | 10/2008 | Maneuf et al. | |
| 2010/0089881 A1* | 4/2010 | Bruland et al. | 219/121.68 |

FOREIGN PATENT DOCUMENTS

| | | |
|---|---|---|
| DE | 19541085 A1 | 5/1997 |
| GB | 2439962 A | 1/2008 |
| WO | 2008056116 A1 | 5/2008 |

* cited by examiner

*Primary Examiner* — Olik Chaudhuri
*Assistant Examiner* — Wilner Jean Baptiste
(74) *Attorney, Agent, or Firm* — David A. Guerra

(57) ABSTRACT

The invention relates to a laser scribing system (10) for structuring substrates, said system being characterized in that the planar rotor (56) together with the laser device (60) has a mass that is essentially less than the mass of the table (20) and the substrate (30) such that the machining speed is increased, and the substrate arranged on the table (20) is still during the machining, or moves in a direction at a constant speed vSubstrat such that vibrations are reduced and the precision of the scribing traces increased. Furthermore, other planar rotors (56) can be mounted with a laser device (60) without changing the structure of the machine such that the productivity is easily increased. The laser light (65) is also guided, by means of optical fibers, as close as possible to the machining point, reducing the free length of the light beam (65) such that the adjustment requirements for the optical-mechanical components are reduced and the system is more robust.

19 Claims, 9 Drawing Sheets

The orientation of the coordinate system is:

- x - direction: in the direction of the scribing lines to be created (corresponds to the main direction of movement)
- y – direction: in the direction transverse to the main direction of movement The orientation of the coordinate system in the machine is:

- x-direction in the direction of the scribing lines to be created

Main direction of movement

- y – direction: direction transverse to the main direction of movement

- z – direction: according to the coordinate system turning to the right from below upwards (not illustrated)

LASER-SCRIBING SYSTEM FOR STRUCTURING SUBSTRATES FOR THIN LAYER SOLAR MODULES

CROSS-REFERENCE TO RELATED APPLICATIONS

This application is an U.S. national phase application under 35 U.S.C. §371 based upon co-pending International Application No. PCT/DE2009/000985 filed on Jul. 14, 2009. Additionally, this U.S. national phase application claims the benefit of priority of co-pending International Application No. PCT/DE2009/000985 filed on Jul. 14, 2009, and Germany Application No. 10 2008 033 610.6 filed on Jul. 17, 2008. The entire disclosures of the prior applications are incorporated herein by reference. The international application was published on Jan. 21, 2010 under Publication No. WO 2010/006589.

The invention relates to a laser-scribing system for structuring substrates, typically for structuring glass substrates during the production of thin-layer solar modules, but also for structuring glass substrates when producing TFT-monitors as well as for structuring flexible substrates and metal substrates for the production of thin-layer solar modules and TFT-monitors according to the generic clause of attached Claim 1, as known from various documents such as WO 2008/056116 A1, U.S. Pat. No. 6,559,411 B2, US 2008/0263877 A1 or GB 2439 962 A. The invention also relates to a process for structuring a substrate by means of such a laser-scribing system.

Laser-scribing systems for structuring substrates for thin-layer solar modules are known. For laser-structuring of thin-layer solar modules at least three electrically-conductive layers—designated as P1-, P2- and P3-layer, applied in sequence one above the other by coating processes, are, linearly and at specific intervals, each cut through completely by laser light, immediately after applying the respective layer, so as to bring about an in-series circuitry of the individual cells. Apart from complete electric isolation, there exist particularly high demands concerning the geometry of the so-called scribing line with regard to straightness, parallelism, accurate spacing as well as the requirement that the sequentially-applied tracks P1-, P2- and P3 must be configured very closely to one another in order to keep the so-called "Dead Zone" as small as possible. The tolerances for these geometric criteria are approximately +/−10 μm on a length of the individual scribing lines of about 500 mm up to 2600 mm. This ratio of small tolerances and large processing lengths explains the particularly high demands made to the basic construction of the laser-scribing machines used therefor.

STATE OF THE ART

For the laser-scribing machines known today, the following three kinematic concepts are used:
1. Scanner Systems In these machines, the light beam of the laser source is guided and moved onto the surface of the substrate by means of a scanner. The following specific solutions are known:
Pure Scanner Systems As described in U.S. Pat. No. 6,559,411 B2, the scanner guides the light beam over the entire length of the substrate. The advantage of this solution is that for creating the scribing line no movement of the substrate or a platform is required so that the moved mass is small. The drawback is that the focusing optical elements require either a very large depth of focusing in order to attain a separation of the material over the entire length of the glass substrate at highly varying orientations of the laser beam, or that the scanner needs to be re-adjusted in the z-direction so as to remain within the focusing range of the optics. However, a high depth of focus affects the attainable minimum size of the light spot and the shape of the light spot to such an extent that a system configured in this manner cannot be used for all desired substrate lengths and, consequently, processing lengths. Scanner systems known to date are limited to a scribing length of about 600 mm.
Scanner-Stepper Systems In order to avoid the described problems, the scanner movement as described in GB 2 439 962 A—is matched to a platform movement. In this case, the following alternative solutions are pursued:

A The scanner movement of a single scanner is so adapted to the platform movement that the scanner divides only a relatively short line segment; thereafter the platform is displaced with the substrate about the length of the divided segment so that, by overlapping, the individual line segments are pieced together and a scribing line is brought about over the entire length of the substrate. Apart from the time expenditure due to the repeated piecing-together, the transition of the individual line segments is very critical, since the latter must be brought about without misalignment, in order to attain a complete electric isolation, even at the transition points.

B In order to save processing time, a plurality of scanner heads is used and so matched to each other that the partial lines created by the latter merge into one another. In this manner, a complete scribing line can be created, provided a sufficient number of scanner heads is used. Apart from the adjustment effort required for the mechanical adaptation of the individual scanners, the required apparatus cost is very high, as scanner heads are very expensive. In addition, for this solution as well, the problem of misalignments once again remains.

Due to the afore-described reasons, scanner solutions have, in practice, not been able to gain acceptance to date.
2. Movement of the Substrate and/or the Laser Unit on an x/y Platform The currently conventional design of laser-scribing installations is that on a granite block is mounted a movable platform, which executes the cutting movements in the direction x. The individual tracks are created by the laser unit movable in direction y. For this purpose, the laser unit is mounted on a y-carriage, which, in turn, is movably-arranged on a stationary gantry-system or is sunk into the machine bed. Alternatively, the movable platform may also bring about the y-movement for creating the individual tracks (x/y platform) or the platform is stationary and the gantry-system also performs the movement x together with the laser unit(s).

From WO 2008/056116 A1 a laser-scribing system for structuring substrates for thin-layer solar modules is known which has this typical structure. The coated substrate for thin-layer solar modules is positioned on a movable platform, which is able to carry out linear movements in a first direction x and a direction opposite to the first direction −x. In this context, at least one optical unit is present, which deflects a laser beam to the surface of the substrate, focusing it onto the surface of the substrate or dividing it into a plurality of laser beams and then focusing the latter onto the surface of the substrate. The optical unit is fitted to a movable unit which is mounted movably on a portal. The movable unit can perform linear movements in a second direction y, normal to the first direction, and in a direction opposite to the second direction −y. Due to the movement of the platform in the first direction x, at least one scribing track is created on the substrate in the first direction x.

After the at least one scribing track has been created along the entire length of the substrate, the movable unit is moved in the second direction y and placed into a new position. Subsequently, the platform is moved in the direction opposite to the first direction −x. This creates at least one further scribing track, running parallel to the at least one scribing track previously created. In this manner, the entire substrate may be provided with scribing tracks.

A similar laser-scribing system is also the laser-scribing system JENOPTIK-VOTAN™ of the company JENOPTIK Automatisierungstechnik GmbH, Konrad-Zuse-Strasse 6, 07745 Jena, Germany.

The laser-scribing system JENOPTIK-VOTAN™ G is designed for substrates having outer dimensions with a width from up to 1.1 m and a length of up to 1.4 m. The movable platform is in this case mounted on a granite block and is able to perform movements in the first direction x and in the direction opposite to the first direction −x. A laser device is in this case fitted to a movable unit, comprising a carriage, which is movably mounted on a portal. The carriage can perform linear movements in a second direction y, normal to the first direction, and in a direction opposite to the second direction −y along the portal. Here, scribing lines can be created on a substrate in the first direction x and in the direction opposite to the first direction −x.

These afore-described concepts are simple and robust, but suffer from the following drawbacks:

A Very high masses are moved about. For generating the long cutting paths, the platform is either moved about with the glass substrate clamped thereon along its axis x in reversing mode or the portal with the laser heads/optical units moves over the entire cutting path in reversing mode; in the main cutting direction the moved masses are therefore very large, possibly even exceeding 100 kg.

B Influence on precision and productivity: Due to the large masses moved, vibrations within the laser-scribing system are generated by the high starting and braking forces. Since vibrations within the laser-scribing system negatively affect the uniformity of guiding the laser beams generated by the existing laser devices and, consequently the, accuracy and quality of the created scribing tracks, the platforms or portals of the existing laser-scribing systems must often be driven relatively slowly (usually at present 1-2 m/s), which is, however, detrimental to productivity.

C High production and transport costs: These machines are designed to be very heavy, in order to dampen machine vibrations. Normally e.g. granite stones are used for weighting. Since the guiding units are mounted on these stones, the latter must, in addition, be formed with great precision. Production costs for such large and precision-made granite stones are therefore very high. Subsequent transport to the customer further increases the transport costs due to the heavy weight.

D The machines are very big, because the platform with the substrate clamped thereon is moved, therefore requiring about twice the length of the processing path.

E Risk of damage: Since the substrates to be structured are very often glass substrates, the risk—due to constant movement of the platform—of destroying the substrate due to glass fractures during structuring of larger glass substrates increases considerably if higher processing rates are used in order to increase productivity.

When using these at present conventional concepts, the problems cited will increase, if, in future, increasingly larger formats (e.g. Gen 8.5: width 2.200 mm; length 2.600 mm) will have to be processed. In this context, the masses to be moved and, as a result, the vibration tendency will increase considerably. The required outer dimensions will increase considerably when using the conventional laser-scribing systems of today; first machines for Gen 8.5-formats having a mass of up to 15.000 kg and a length of about 8 meters are commercially known.

Despite the afore-described disadvantages, machines having this structure are used predominantly today, since to date no other solutions are known which are similarly robust.

3. Flying-Optics-System

Similarly to what is described in US 2008/0263877 A1, in this machine design one or a plurality of laser beams are guided onto the surface of the substrate through a plurality of movable optical elements (mirrors, lenses) in the cutting direction along the longitudinal side of the substrate. The laser sources are arranged in a stationary manner.

This solution as well has not proven successful in industrial practice, because the optical elements need to be adjusted very accurately in relation to each other in order to guide an open beam having a length of e.g. 1000 to 2000 mm in the micron tolerance range onto the surface of the glass substrate. The adjustment performed must, in addition, be repeated regularly and at relatively short intervals, since minor mechanical changes, occurring during operation, due e.g. to vibrations and temperature variations already have major effects on the position of the light beam. A further drawback is that the open beam must be kept free of contaminations such as dust, in order to not negatively affect the beam quality.

Flying optics systems are nowadays used predominantly in laboratory machines. In the real production environment problems occur, in practice, with re-adjusting the mechanical-optical settings.

OBJECT OF THE INVENTION

It is the object of the invention to so design a laser-scribing system, having the features of the generic clause of claim 1, that the known drawbacks of system concepts existing to date are avoided. This concerns, in particular, the selection according to the invention of the drive concept for moving the laser device and the novel structure of the laser-scribing system according to the invention resulting therefrom.

The essential ancillary condition when choosing the drive concept is that for laser-scribing a non-ambiguous preferred direction of movement exists, which runs along the scribing lines. Considerably more than 90%, for large substrates even more than 99% of the operational movement required during laser-scribing fall into this preferred direction. For this reason, a clear reduction of the moved masses in this preferred direction is desirable in order to attain a considerably-increased productivity at higher moving rates.

In addition, increased accuracy and quality of the scribing tracks created therewith are to be attained on the substrate.

Furthermore, the entire structure should be robust, in order to exclude e.g. protracted adjusting operations recurring at short time intervals.

By avoiding the repeated starting and braking motions of the substrate, it is intended to attain a minimization of the risk of damage to and destruction of the substrate.

In addition, production costs are to be lowered considerably.

To sum up, the following objects are attained by the invention:

The masses moved, in particular in the preferred direction, are significantly reduced so that considerably higher processing rates are attained.

The substrate is stationary during laser-scribing or is moved in one direction at a constant rate so that vibrations are considerably reduced, the quality of scribing lines is consequently increased and the risk of damaging the substrate during processing is thereby reduced.

Highly-dynamic drive means with highly repeatable precision are used so that scribing lines are created by means of active controls with the highest precision.

The transmission of the laser light to the processing point takes place in such a way that the open beam length is minimized. In this manner the adjustment time for fine-tuning the mechanical-optical components is reduced considerably so that the laser-scribing system is rendered more robust.

The scribing lines are created in one process step, even in the event of large substrate lengths so that, contrary to piecing-together individual line segments, misalignment problems are avoided and complete electrical isolation is attained even in long lines.

These objects are attained by a laser-scribing system according to claim 1. Advantageous further developments of the invention form the subject of the subsidiary claims.

A corresponding process for structuring a substrate and a thin-layer solar module, comprising at least one substrate, structured by means of the laser-scribing system according to the invention, each forms the subject of a subsidiary claim.

DESCRIPTION OF THE INVENTION

Basic Design

The laser-scribing system according to the invention for structuring substrates comprises a platform for accommodating at least one substrate, at least one planer stator, fitted in spaced-apart relationship to the platform, at least one planar armature freely-movable in the directions x and y, and at least one laser device mounted on the planar armature for creating the scribing tracks on the substrate in a first direction x and in a direction opposite to the first direction −x.

A planar drive means has, inter alia, the following technical properties:

High dynamics (up to 25 m/s$^2$)

High moving rates (up to 4 m/s are possible), while the conventional laser-scribing systems of today are operated at moving rates of 2 to 3 m/s max.

A highly repeatable precision (+/−2 μm) ensures an accurate scribing track.

A low mass of the armature of 10 kg maximum so that the moved mass of the driving unit is considerably reduced.

There are no mechanical coupling elements such as clutches, braces etc. between the x and y axis, since these are housed in the planar armature represented by a linear motor. This makes the overall movement more accurate, as mechanical tolerance and friction are obviated.

Wear-free air mounting and, consequently, no slip-stick-effects ensure a very high uniformity of movement.

It is possible to employ a plurality of armatures on a stator so as to attain higher productivity by a plurality of processing heads, without substantial modifications of the machine design.

The planar armature may perform both the main movement in the laser-scribing direction x and the feed movement for creating the individual tracks in the direction y in a single unit. This ensures that only very small masses move in both directions of movement.

A further advantage of the planar drive for laser-scribing is that the integrated planar stator fulfills a dual-function: it is, on the one hand, the driving component on which the movement of one or more planar armatures takes place. Since the planar stator itself has a specific mass, this also has a damping effect on the still-remaining residual vibrations. It is not necessary to install heavy and accurately-tailored granite stones, solely for the purpose of weighting.

It is a further advantage of the planar drive for laser-scribing that the machine is of markedly flat design and requires little space, since the platform need not be moved.

On the basis of these properties, a planar drive is very well suited to perform the movements of the laser devices required for laser-scribing.

Description of the Design of a Laser-Scribing System Having a Planar Drive Means Embodiment 1

In the following description, one proceeds from the fact that a planar drive means is used in combination with a fiber-laser. In addition, it is assumed that the substrate stands still during processing. Deviating, advantageous modifications of the invention are described separately in the text. This design is shown schematically in FIGS. 1 and 2, while FIGS. 3 and 4 show a construction embodiment.

The basic structure of this so designed laser-scribing system is as follows:

1. The planar stator 46 corresponds to the size of the substrate 30 to be processed. The planar stator is inserted into the support body 40, designed as a machine frame, and is aligned horizontally by adjustment.
2. Onto the planar stator one or a plurality of planar armatures 56 are placed.
3. On each planar armature 56 one or more laser devices 60, consisting of the optical elements for bringing about one or more laser light spots, are mounted. These are specifically:
   a. A mechanical mounting device 62 for one or more optical fibers 61
   b. One collimation optics device 63 per optical fiber
   c. One pair of deflecting mirrors 64 per optical fiber for guiding the light to the processing point at the desired spaced-apart relationship.
   d. One focusing optics device 66 per optical fiber
4. The laser sources 67 for generating the laser light are mounted rigidly on the machine support or the machine frame 90.
5. From the laser sources 67 one or more optical fibers 61 lead to a planar armature 56. These optical fibers may have a length of several meters (up to 5 meters) so that the laser light can be guided very close to the actual processing point and the open beam length is restricted to the path within the laser device 60.
6. The substrate 30 to be processed is retained in a fixed processing position by means of mechanical fixation and does not move.

The particularity of the laser-scribing system according to the invention is the combination of the following properties:

The moved masses of the drive means are considerably reduced; in addition, the substrate is standing still during processing.

This achieves a considerably higher processing rate while the accuracy of the scribing tracks created increases due to reduced vibrations.

For further increasing the productivity, additional processing heads may be integrated in a cost-effective manner without substantial mechanical modification by using a plurality of planar armatures.

The laser light is guided as close as possible to the processing point by means of optical fibers so that the open beam length is reduced and the adjustment effort is decreased so that the system is more robust in an industrial production environment.

The movable planar armature can perform movements on the planar stator in the first direction x and in the direction opposite to the first direction −x; together with the co-moved laser device it has a mass which is substantially less than the mass of the substrate and a movable platform together. The moved mass is therefore very small during creation, in particular in the direction of the scribing tracks. This is advantageous, since the laser device must be moved rapidly and in alternating directions for creating scribing tracks.

The planar armature employed, together with the laser device fitted thereon, has a mass of, in particular, approximately 15 kg. This means that the moved mass during creation in the direction of the scribing tracks amounts to less than a fifth of a platform with clamped-on substrate or of a moved portal, which may both weigh up to 100 kg and more.

Therefore, in the laser-scribing system according to the invention virtually no vibrations occur during the creation of scribing tracks. In this way, high-quality scribing tracks are created, which in each case run very accurately along a predetermined path, such as e.g. a straight line.

As during the creation of scribing tracks very small masses are moved in the direction of the scribing tracks and for that reason virtually no vibrations are brought about by starting and braking forces, the laser-scribing system according to the invention need not additionally be weighted, which, in turn, saves costs for components and transporters.

As virtually no vibrations occur during movement of a small mass, the laser beams generated by the laser devices used may be moved uniformly and at high speed. This allows the cost-effective creation of many scribing tracks on a substrate in the shortest possible time, which in each case run very accurately along a predetermined path, such as e.g. a straight line.

In the laser-scribing system according to the invention, the planar stator may be provided in a simple manner and cost-effectively by known processes. In the laser-scribing system according to the invention the at least one planar armature may likewise be provided in a simple manner and cost-effectively by using known processes. In addition, few mechanical precision components are required, since the required accuracy is attained by control procedures on the planar armature so that, as a whole, the production costs for such a laser-scribing system decrease considerably.

The planar stator is fitted below the substrate. As a result, the at least one laser beam generated by a laser device fitted on a planar armature can impact the substrate from below, causing particles in the lowermost layers of the substrate to be evaporated by the laser beam. Due to the pressure of the vapor formed in the course thereof, adjacent particles are blasted away in the layers of the substrate resting thereon. The scribing tracks are thus created from above more rapidly and with less energy expenditure than with radiation of the substrate, in which case the particles to be removed from the laser beam need to be vapor-deposited layer by layer.

In particular, the planar armature comprises at least one first programmable element which is connectable to and controllable by a first control device. As a result, the movements of the planar armature along the main direction of movement may be predetermined and controlled by the first control device, permitting the creation of scribing tracks on the substrate, having in each case a very accurate orientation along a predetermined path.

In the laser-scribing system according to the invention, the planar armature comprises at least one second programmable element, which is connectable to and controllable by the first control device. In this manner, the movements of the planar armature in the second direction y and in the direction opposite to the second direction −y, i.e. transversely to the direction of the scribing tracks may be controlled by the first control device and, consequently, be predetermined very accurately.

Due to this free programmability of the movements of the planar armatures, both in the direction of the scribing tracks and transversely thereto, it is possible for the desired paths to be generated rapidly by program adjustment and parameterization. This property is advantageous if, e.g., changed set-up conditions or modified mechanical properties require an adaptation, e.g. by calibration. The accuracy of the scribing tracks need in this case not be generated by mechanical accuracy of a guiding system. In sum, path inaccuracies which are due to e.g. mechanical inaccuracies or changed environmental conditions are compensated in a simple manner and cost-effectively by an automatic path calibration.

Further Advantageous Embodiments

Embodiment 2

Continuous Movement of the Substrate Through the Machine, See FIG. 11

In a further preferred embodiment of the invention, a first substrate is not fixed, but moved through the laser-scribing system at continuous speed $V_{substrate}$ in the direction y. This prevents, on the one hand, that the substrate is strained by acceleration processes, on the other hand this mode allows the continuous tracking by a second substrate which, like the first substrate, moves in the direction y with $V_{substrate}$. In this manner, the time for loading and unloading is minimized considerably, thus permitting further increased productivity.

The planar armature, in this mode, performs a total movement, which consists of the movement at the desired scribing speed $V_{lengthwise}$ in the main direction of movement, and a transverse movement $V_{transverse}$, in which case $V_{transverse}=V_{substrate}$ applies. In this manner, the planar armature moves slightly obliquely in relation to the stator, but on the substrate the desired straight scribing line is brought about once again. After termination of processing of a first substrate, the planar armature moves to the starting position and processing of a second substrate, which has in the meantime reached the processing position, commences.

The free programmability of the movements of the planar armature both in directions of the scribing tracks and transversely thereto, makes it possible that the laser-scribing system according to the invention creates precise scribing tracks, because the transverse movement of the planar armature may be accurately synchronized with the movement of the substrate.

Embodiment 3

Use of a Plurality of Planar Armatures on a Planar Stator (See FIG. 5)

In the laser-scribing system according to the invention, the number of planar armatures may be multiplied relatively easily, without having to effect basic mechanical modifications on the laser-scribing system. According to the number of planar armatures, the number of laser devices employed increases accordingly, and, as a result, so does the productivity of the laser-scribing system according to the invention.

Laser-scribing system comprising up to nine or more planar armatures on a planar stator are proposed here.

The free programmability of the movements of the planar armatures both in directions of the scribing tracks and transversely thereto, make it possible that with the laser-scribing system according to the invention at least two planar armatures can be employed with synchronized movement in opposite directions, resulting in a uniform load on the planar stator and, consequently, in further minimizing the vibrations.

Embodiment 4

Use of a Plurality of Planar Stators Each Comprising One Planar Armature, No Figure The laser-scribing system according to the invention may comprise a panel-shaped or strip-shaped planar stator.

On a panel-shaped planar stator a plurality of planar armatures on a planar stator plate may be employed in order to increase in a simple manner the productivity of the laser-scribing system according to the invention.

Alternatively thereto, a plurality of relatively narrow, strip-shaped planar stators, each having a planar armature may likewise be employed in the laser-scribing system according to the invention for increasing the system productivity in a simple manner with at the same time lower costs for an individual planar stator.

Embodiment 5

Planar-Armature with Flying Optics Fitting (See FIG. 9)

In a preferred embodiment of the laser-scribing system with planar drive means, the planar armature is used in such a manner that it carries the components of presently-known flying optics fittings (mirrors, lenses); the laser source 67 is stationary and emits an open beam, directed onto the optical elements of the planar system; the latter guide the beam onto the surface of the glass substrate. The scribing line is created by the movement of the planar armature in the direction x.

The remainder of the machine structure remains unchanged.

In contrast to the present-day flying optics systems, the advantage of this solution resides in that the planar armature in the plane of the planar stator is freely programmable in the direction x and y and can thus be compensated by programming and parameter adaptation of any modifications of the direction of the open beam, without necessitating a mechanical adjustment as in present-day flying optics systems.

Embodiment 6

Planar Armature with Fully-Integrated Solid State Laser (See FIG. 8)

In a preferred embodiment of the laser-scribing system with planar drive means, the planar armature is used in such a manner that it carries one or a plurality of fully-integrated solid state lasers, which are commercially available (e.g. the model Explorer from the company Newport), and which are adjustable manually or automatically in spaced-apart relationship to one another. The advantage is that such lasers are meanwhile very compact (length about 165 mm; width about 55 mm, height about 100 mm) and are of light-weight (approximately 1 kg), thus obviating feeding of the laser light by means of a fiber.

The remainder of the machine structure remains unchanged.

Embodiment 7

Fitting of the Planar Drive Means Above the Substrate, See FIG. 6

In a further preferred embodiment of the invention, the planar drive means is fitted above the substrate. This configuration is advantageous and/or necessary in the event that the laser light cannot penetrate through the substrate from below. This is the case where layers of reflecting materials have to be applied so that all further layers applied to these reflecting materials can no longer be ablated from below.

Since the planar armature comprises permanent magnets for generating advancing forces, the forces of the said permanent magnets secure the planar armature on the planar stator against gravitational force. This principle may be utilized in a simple manner in order to also fit the planar drive means above the substrate.

The remainder of the machine structure remains unchanged.

LIST OF REFERENCE NUMERALS

10 Laser-scribing system
20 Platform
30 Substrate
40 Support body
46 Planar stator
50 Movable unit
56 Planar armature
60 Laser device
61 Optical fiber
62 Mounting device
63 Collimation optics device
64 Deflecting mirror
65 Laser beam
66 Focusing optics device
67 Laser source
70 Scribing tracks
71 Scribing track: direction +x
72 Scribing track: direction −x
73 Lateral stroke direction +y/−y
90 Machine frame

DRAWINGS

DETAILED ELUCIDATION OF THE DRAWING

Figure 1:
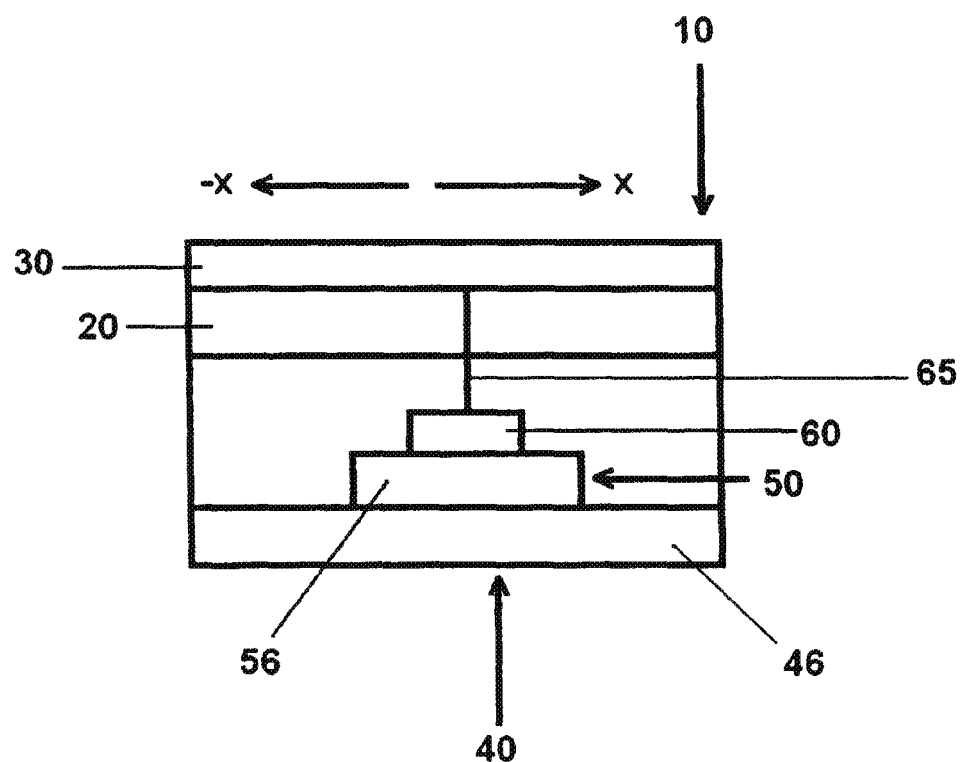
FIG. 1 A schematic sectional view in the direction of the scribing tracks through the laser-scribing system 10 according to the invention FIG. 2 A schematic plan view of the laser-scribing system 10 according to the invention FIG. 3 A construction example in perspective view of the laser-scribing system 10, shown without the platform 20 and without the substrate 30

According to a first embodiment, FIG. 1 shows a schematic sectional view through a laser-scribing system 10 according to the invention in the direction of the scribing tracks 70, the said laser-scribing system including a platform 20 on which rests a substrate 30. A support body 40 is provided underneath the platform, including a panel-shaped planar stator 46 and being coupled to the platform 20. On the planar stator 46 a movable means 50 is present, comprising at least one planar armature 56, which is able to perform movements both in a first direction x and in the direction opposite to the first direction −x, as well as in a second direction y, normal to the first direction x and in the direction opposite to the second direction −y. A laser device 60 with at least one laser beam 65 is fitted to the planar armature 56, creating the scribing tracks 70 on the substrate 30 by laser light from below in the first direction x and in the direction opposite to the first direction −x.

Figure 2:
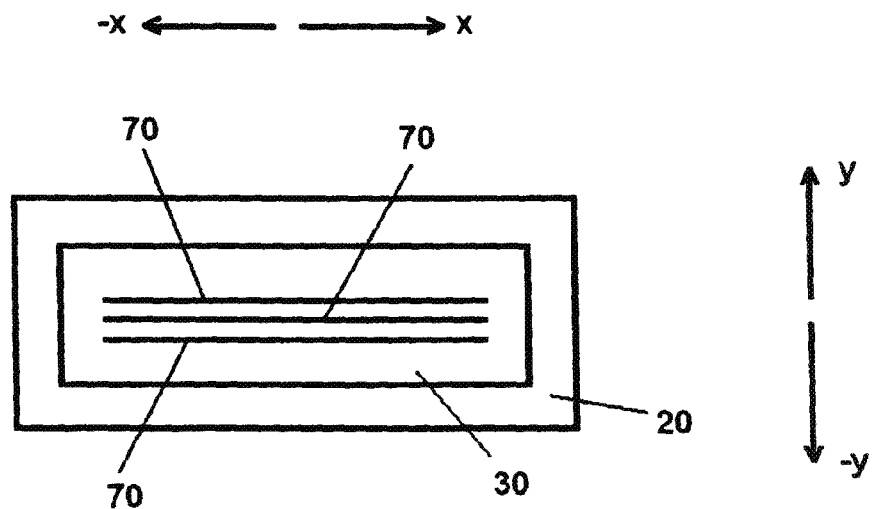

FIG. 2 shows a schematic plan view of the laser-scribing system 10 according to the invention in accordance with the embodiment of FIG. 1, wherein a platform 20, loaded with the substrate 30, can be seen. On the substrate, in the first direction x and, respectively, in the direction opposite to the first direction −x, three scribing tracks 70 were created in evenly spaced-apart relationship in the second direction y, normal to the first direction.

Figure 3:
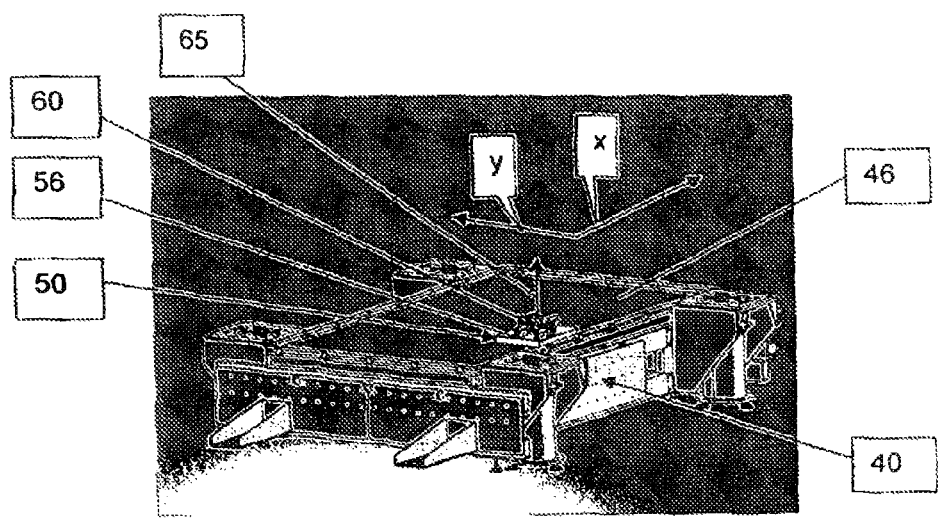

FIG. 3 shows a construction embodiment in perspective view of the laser-scribing system 10 according to the embodiment of FIG. 1, without platform 20 and without substrate 30. The Figure shows the support body 40, configured as a machine frame; the planar stator 46 is sunk into the machine frame. In addition, a movable unit 50 is shown which is provided on the planar stator and serves as planar armature 56, comprising a laser device 60 fitted thereon and an emitted light beam 65. The Figure also shows a descriptive coordinate system for illustrating the directions.

Figure 4:
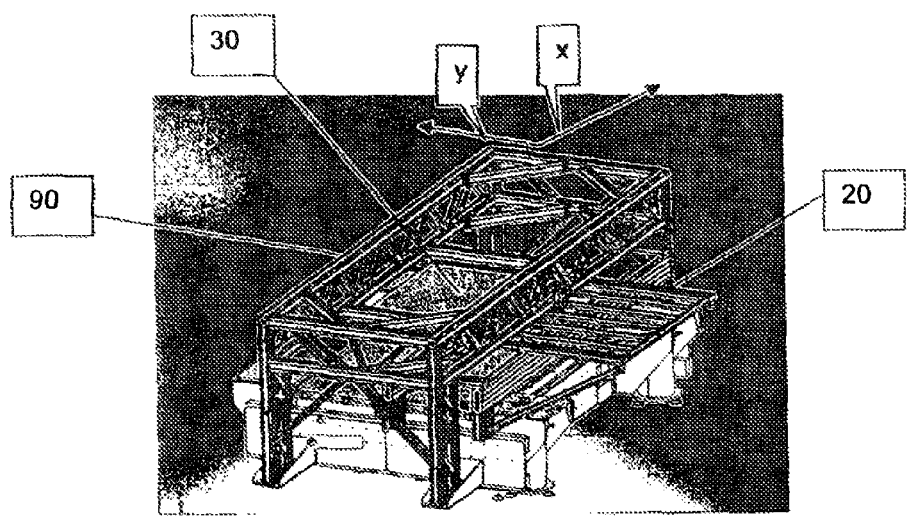
FIG. 4 A construction example in perspective view of the laser-scribing system 10, as in FIG. 3, shown with the platform 20 and the substrate 30

FIG. 4 shows a construction embodiment in perspective view, as in FIG. 3, but including the platform 20, the substrate 30 and the machine frame 90 of the laser-scribing system 10 according to the embodiment of FIG. 1.

Figure 10:
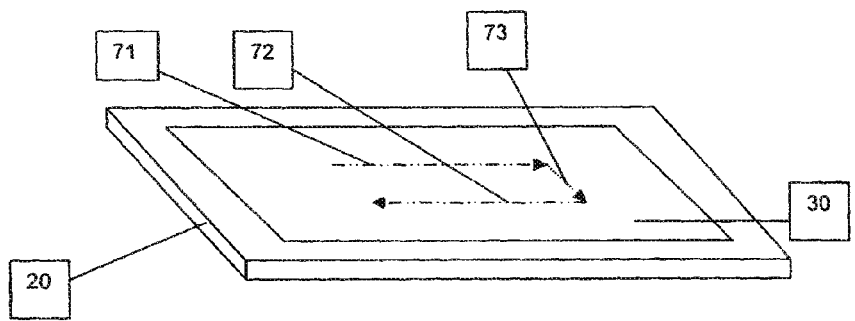

The platform 20 is shown in a loading position. The substrate 30 is shown in a processing position and is stationary during processing, secured by a mechanical locking device. Prior thereto, the substrate 30 was moved into the processing position by the platform mechanisms. The machine frame 90 serves to fit auxiliary systems, such as e.g. cameras. The planar armature 56, not visible in FIG. 4, moves on the planar stator 46 in the direction x below the substrate, thereby creating one or more scribing tracks. Further scribing tracks are created in that the planar armature, at the end of a stroke, performs a movement in the y-direction, as illustrated in FIG. 10, over the length which is a multiple of the track spacings.

Figure 5:
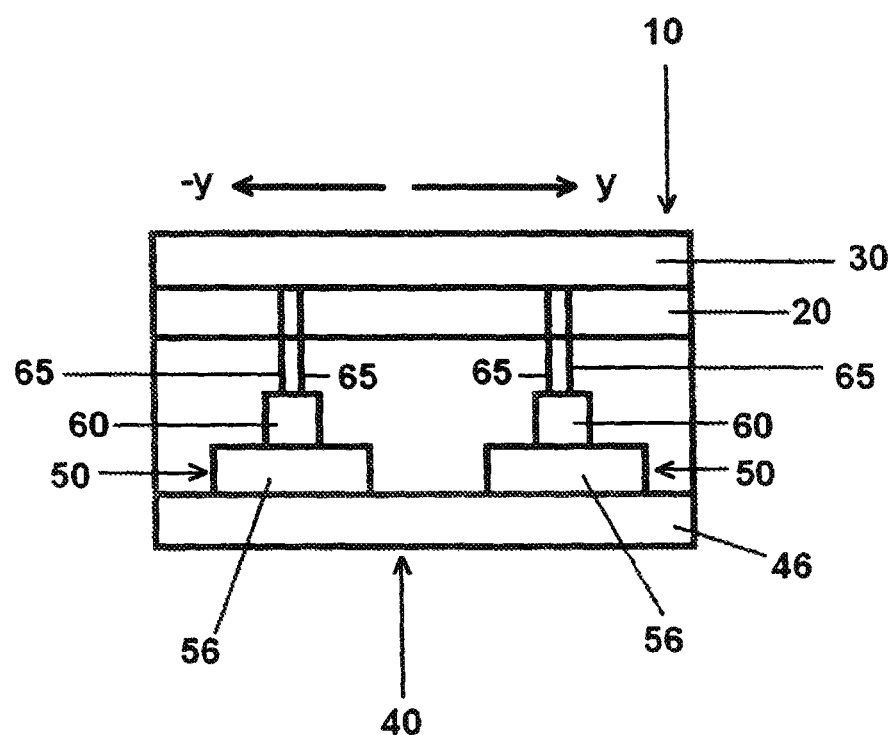
FIG. 5 A schematic sectional view transversely to the direction of the scribing tracks through the laser-scribing system 10 according to the invention FIG. 6 A schematic view for an advantageous embodiment of the laser-scribing system 10, including the planar drive means, fitted above the substrate FIG. 7 A schematic view for a first advantageous embodiment of the laser device 60, comprising a fiber laser FIG. 8 A schematic view for a second advantageous embodiment of the laser device 60, including a compact solid state laser FIG. 9 A schematic view for a third advantageous embodiment of the laser device 60, including a flying optics fitting FIG. 10 A schematic view of the scribing movement of the planar armature 56 in a stationary substrate 30

FIG. 5 shows a schematic sectional view through a laser-scribing system according to the invention, transversely to the direction of the scribing tracks 70, in accordance with the first embodiment of FIG. 1, wherein two planar armatures 56 can be seen, each comprising two laser beams 65. The two planar armatures 56 are able to move synchronously in opposite directions at the same speed.

Figure 6:
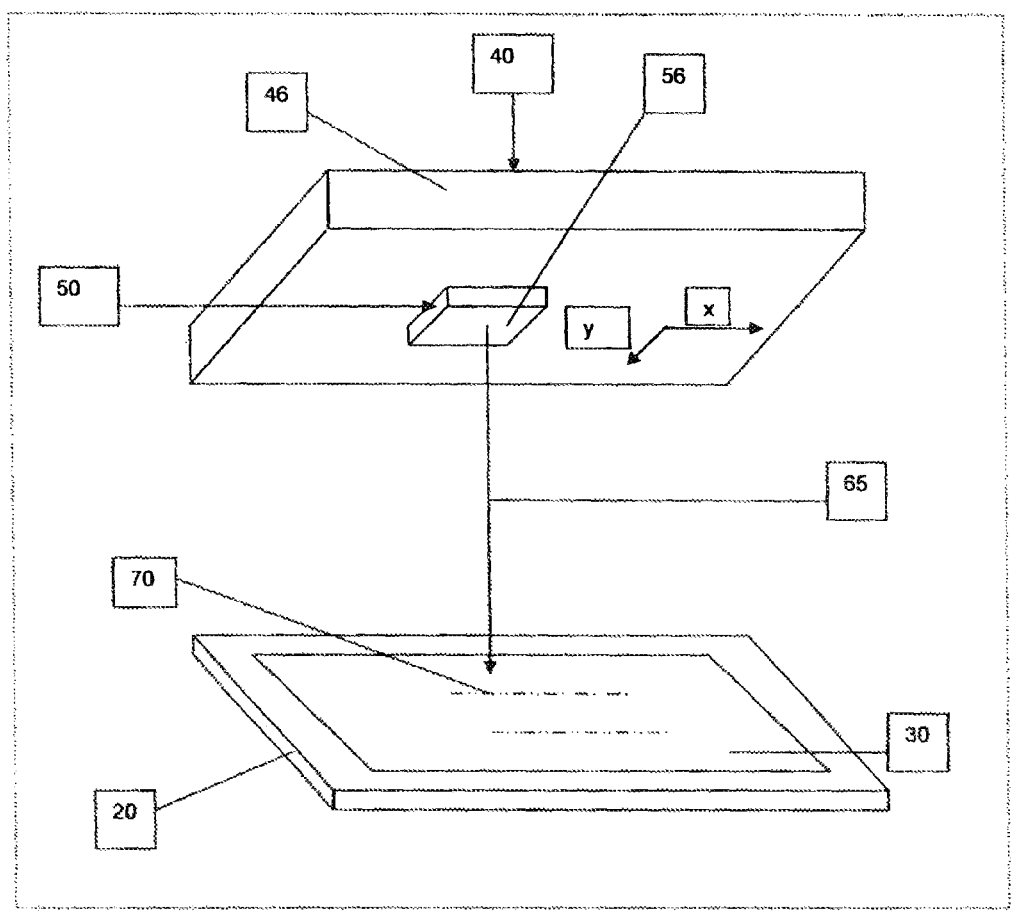

FIG. 6 shows a schematic perspective view of the laser-scribing system 10 according to the invention, in accordance with a second embodiment, including a platform 20 onto which a substrate 30 is placed. Above the platform a support body 40 is provided, comprising a panel-shaped planar stator 46 and being coupled to the platform 20 (not shown). A movable unit 50 is present underneath the planar stator 46 comprising at least one planar armature 56, which is able to perform movements both in a first direction x and in the direction opposite to the first direction −x as well as in a second direction y, normal to the first direction x and in the direction opposite to the second direction −y. To the planar armature 56 a laser device 60 (not shown) is fitted, which emits at least one laser beam 65. The scribing tracks 70 are created in the first direction x and in the direction opposite to the first direction −x on the substrate 30, by laser light from above.

Figure 7:
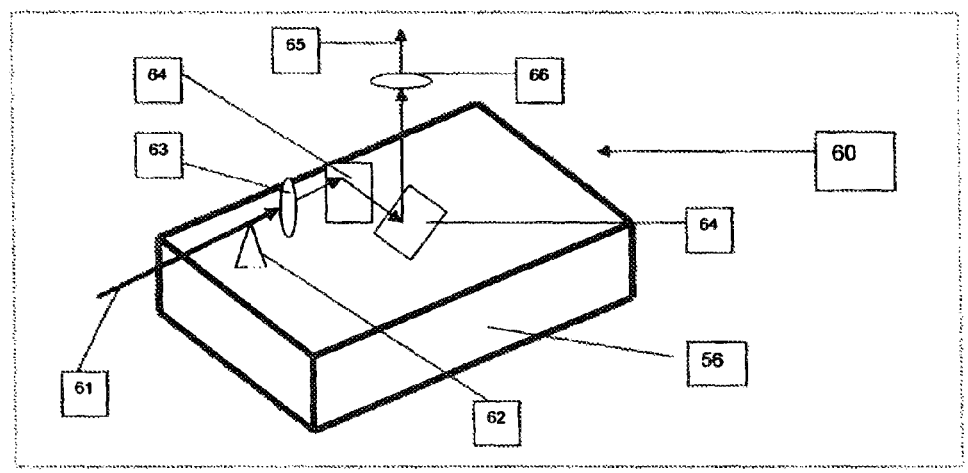

FIG. 7 shows a schematic view of the laser device 60 in a first embodiment, consisting of an optical fiber 61, fitted to a mounting device 62, a collimation optics device 63, a pair of deflecting mirrors 64 as well as a focusing optics device 66. The entire laser device is placed onto the planar armature 56. A plurality of laser devices, manually or automatically adjustable in relation to one another, may be placed on a planar armature. This embodiment of the laser device is employed in a first and second embodiment of the laser-scribing system 10 according to the invention, in accordance with FIGS. 1 and 6.

Figure 8:
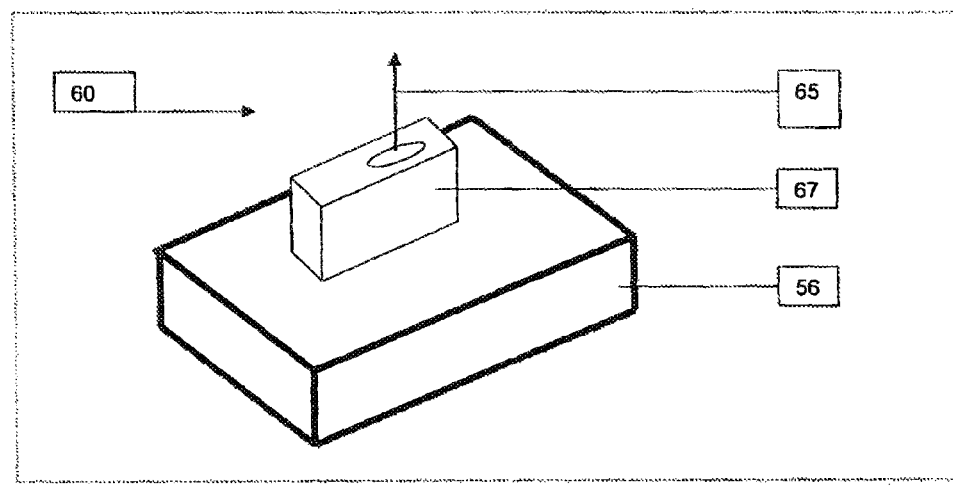

FIG. 8 shows a schematic view of the laser device 60 in a second embodiment, consisting of a fully-integrated solid state laser. A plurality of solid state lasers, manually or automatically adjustable in relation to one another, may be placed on a planar armature. This embodiment may be used as an alternative to the embodiment according to FIG. 7 and is employed in a first and second embodiment of the laser-scribing system 10 according to the invention, in accordance with FIGS. 1 and 6.

Figure 9:
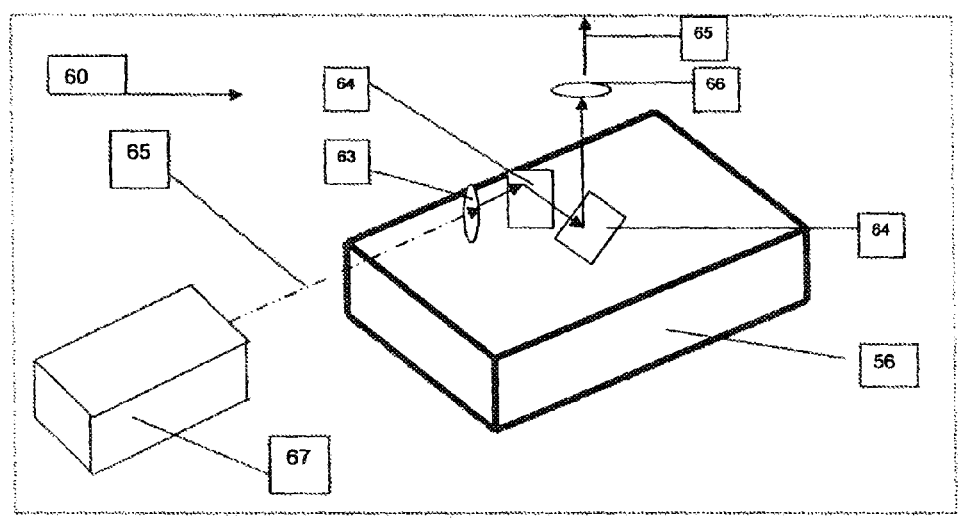

FIG. 9 shows a schematic view of a third embodiment of the laser device 60. The planar armature 56 is used as in a flying optics fitting and carries, as in FIG. 7, a collimation optics device 63, a pair of deflecting mirrors 64 as well as a focusing optics device 66. In contrast to FIG. 7, the laser light is not guided by optical fibers; the laser light is emitted from a stationary laser source 67 as an open beam and is directed onto the planar armature. There it is guided onto the substrate surface by means of the afore-described optical components. A plurality of laser devices 60, manually or automatically adjustable in relation to one another, may be placed on a planar armature. This embodiment of the laser device is employed in a first and second embodiment of the laser-scribing system 10 according to the invention, in accordance with FIGS. 1 and 6.

FIG. 10 shows a schematic view of the scribing movement of the planar armature 56, including a laser device 60, the substrate being stationary. The planar armature performs a first stroke and creates at least one scribing track 71 in the direction +x. When the stroke is terminated, the planar armature brakes and performs a transverse movement 73, the said stroke corresponding to a whole number multiple of the desired track spacings. Thereafter, the planar armature performs a second stroke, creating at least one scribing track in the direction −x.

Figure 11:
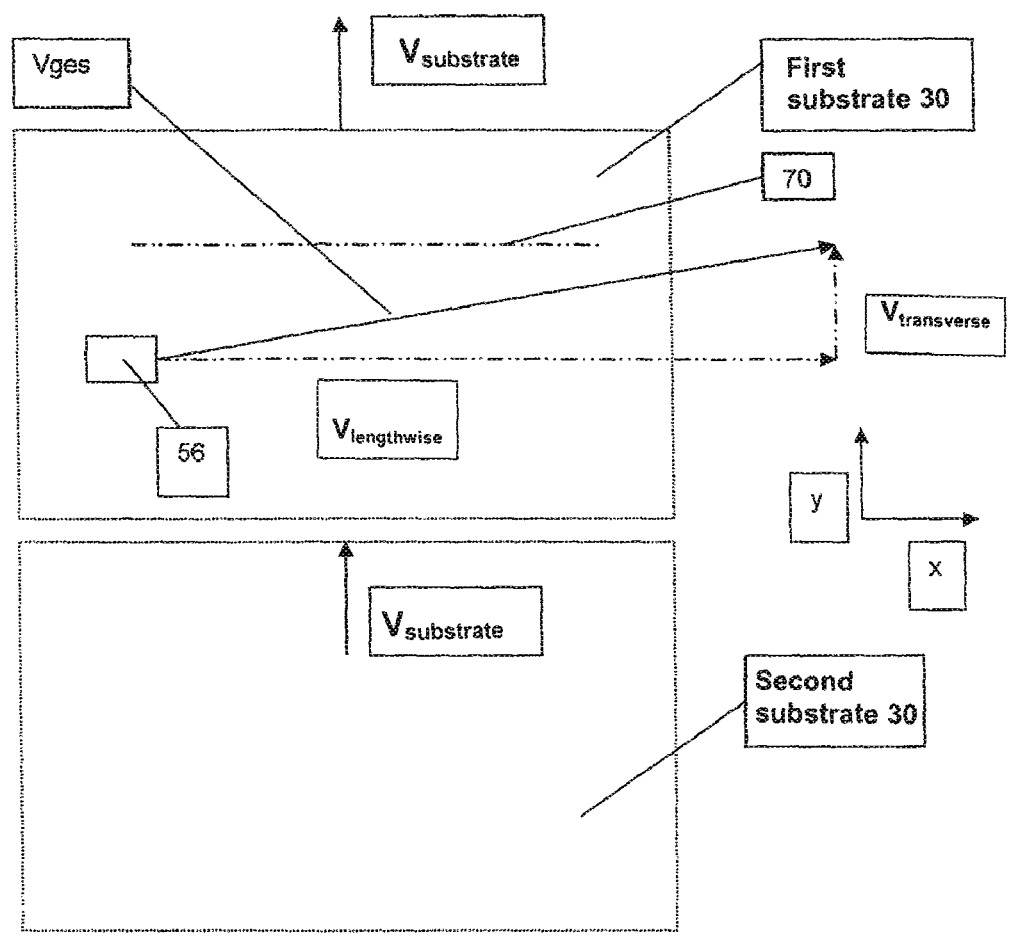
FIG. 11 A schematic view of the scribing movement of the planar armature 56 with substrate 30, moved at a constant rate.

FIG. 11 shows a schematic plan view, illustrating a transverse movement of the planar armature, superposed on the longitudinal movement. In order to move in the scribing direction (direction +x/−x) at a speed $V_{lengthwise}$, a transverse movement of the planar armature is superposed by the speed $V_{transverse}$, if the substrate, instead of being stationary, moves through the laser-scribing system on its own at a constant rate $V_{substrate}$. $V_{transverse} = V_{substrate}$ applies. The result, after termination of a stroke, is once again a straight scribing line on the substrate.

The invention claimed is:

1. A laser-scribing system for structuring substrates, said laser-scribing system comprising:
    a platform for accommodating at least one substrate;
    at least one support body including at least one planar stator, and said support body being fitted in spaced-apart relationship to said platform;
    at least one movable unit associated with said support body, said movable unit including at least one planar armature configured to perform movements both in a first direction x and in a direction opposite to the first direction −x as well as in a second direction y, normal to the first direction x, and in a direction opposite to the second direction −y; and
    one or more laser devices with at least one laser beam are mounted on said planar armature, which creates scribing tracks on said substrate by said laser beam in the first direction x and in the direction opposite to the first direction −x;
    wherein said support body is fitted in relationship to said platform in such a manner that said associated movable unit performs on said support body linear movements in the first direction x and in the direction opposite to the first direction −x, and that said movable unit represented by said planar armature, jointly with said laser device, has a mass which is less than a mass of said platform, jointly with said substrate, such that thereby an increase of a processing rate is attained, vibrations are reduced and, accordingly, accuracy of the scribing tracks is increased.

2. The laser-scribing system according to claim 1, a first control device for programmably controlling movements of said planar armature along the scribing lines direction +/−x.

3. The laser-scribing system according to claim 2, wherein said first control device for programmably controlling the movements of said planar armature in the second direction y and in the direction opposite to the second direction −y.

4. The laser-scribing system according to claim 3, wherein said planar stator is fitted below said platform.

5. The laser-scribing system according to claim 3, wherein said planar stator is fitted above said platform.

6. The laser-scribing system according to claim 3, wherein said laser device further comprising optical-mechanical components including at least one mounting device, at least one optical fiber, at least one collimation optics device, at least one pair of deflecting mirrors, at least one focusing optics device and at least one laser source, the laser light being guided by means of said optical fiber from said laser source to said planar armature, such that an open length of the light beam is reduced, whereby an adjustment effort for said optical-mechanical components is reduced, said laser device is adjustable so that different track widths are set up.

7. The laser-scribing system according to claim 3, wherein said laser device is composed of at least one fully-integrated solid state laser, which is fitted mechanically adjustably to said planar armature, such that track spacings are adjustable.

8. The laser-scribing system according to claim 7, wherein said planar stator is strip-shaped and includes a plurality of planar stators.

9. The laser-scribing system according to claim 3 further comprising a programmable element associated with said platform, wherein said first control device for programmably controlling the movements of said platform in the second direction y and in the direction opposite to the second direction −y.

10. A method for structuring substrates, said method comprising the steps of:
    providing a laser-scribing system comprising: at least one platform onto which a substrate is placed; at least one planar stator fitted at a space-apart distance from said platform; at least one movable planar armature associated with said planar stator; and at least one laser device mounted to said planar armature, said laser device having at least one laser beam for creating scribing tracks on said substrate in a first direction x and in a direction opposite to the first direction −x;
    arranging said planar stator in relation to said platform in such a manner that said associated planar armature performs on said planar stator linear movements in the first direction x and in the direction opposite to the first direction −x;
    designing said planar armature and said laser device in such a manner that said planar armature and said laser device jointly have a mass which is smaller than a mass of said substrate together with said platform; and
    moving said planar armature together with said laser device fitted thereto on said planar stator in the first direction x, or in the direction opposite to the first direction −x, in order to create on said substrate at least one first scribing track by means of said laser beam generated by said laser device.

11. The method according to claim 10 further comprising the step of:
    providing said planar armature in each case with a first control device, and controlling the movements of said planar armature in the first direction x, or in the direction opposite to the first direction −x, by means of said first control device.

12. The method according to claim 11 further comprising the steps of:
    providing said planar armature with means that performs movements in a second direction y, normal to the first direction x, and in a direction opposite to the second direction −y;
    switching off said laser beam generated by said laser device at the end of a creating procedure of said first scribing track and moving said planar armature in the second direction y, normal to the first direction x, or in the direction opposite to the second direction −y from a first position at the end of said first scribing track up to a second position remote by an amount at a start of a further scribing track;
    switching on said laser beam generated by said laser device at the start of a creating procedure of said further scribing track and moving said planar armature, together with said laser device fitted thereto, on said support body in the direction opposite to the creating direction of said first scribing track, in order to create by means of said laser beam, generated by said laser device, on said substrate, said further scribing track, which is spaced apart from said first scribing track and parallel thereto; and repeating of the two preceding steps in order to create a desired number of said scribing and further scribing tracks on said substrate.

13. The method according to claim 12 further comprising the steps of:
providing said platform with a positioning device, by means of which said platform performs continuous movements in relation to said planar stator in a second direction y, normal to the first direction x, and in a direction opposite to the second direction −y; and
providing said planar armature with means that performs movements in the second direction y, normal to the first direction x, and in the direction opposite to the second direction −y;
moving said platform, together with said at least one planar armature at a first constant rate in the second direction y, normal to the first direction x, and simultaneously synchronizing the movement of said platform with the movement of said planar armature in such a manner that, during the creating procedure, a first straight scribing track is created on said substrate;
switching off said laser beam generated by said laser device in a first position at the end of the first scribing track and simultaneously stopping the movement of the at least one planar armature in the creating direction of the first scribing track;
moving the at least one planar armature in the second direction y, normal to the first direction x, or in the direction opposite to the second direction −y from a first position at an end of said first scribing track up to a second position remote by an amount at a start of a further scribing track;
switching on said laser beam generated by said laser device in a second position at the start of said further scribing track and moving said planar armature of said movable unit, together with said laser device fitted thereto, in a direction opposite to a creating direction of said first scribing track, in order to create on said substrate said further scribing track at a distance from said first scribing track and parallel thereto; and
repeating the two aforegoing steps in order to create a desired number of said first scribing and further scribing tracks on said substrate.

14. The method according to claim 13 further comprising the step of:
controlling the movements of said platform in the second direction y and in the direction opposite to the second direction −y by means of said first control device.

15. The method according to claim 10 further comprising the step of:
fitting said planar stator in a location at least one of below said platform, and above said platform.

16. The method according to claim 15 further comprising the step of:
designing said planar stator as at least one of a panel-shaped planar stator, and a strip-shaped planar stator.

17. The method according to claim 15 further comprising the steps of:
fitting at least a first and second planar armatures on said associated planar stator in two positions spaced-apart in both dimensions from one another, which positions each correspond to a start of a new scribing track;
moving said first planar armature, together with said laser device fitted thereto, along said planar stator, at a constant rate in the first direction x or in the direction opposite to the first direction −x, in order, by means of said laser beam generated by said laser device, to create on said substrate said first scribing track, associated with said first planar armature, and simultaneously moving said second planar armature, together with a second laser device affixed thereto, along said planar stator at the same rate as that of said first planar armature in the direction opposite to the direction of creating said first scribing track, associated with said first planar armature, in order to create on said substrate, by means of a laser beam generated by said second laser device said first scribing track, associated with said second planar armature, simultaneously switching off said laser beams generated by said first and by said second laser devices at an end of the creation procedures of said first scribing tracks and movement, in particular simultaneous movement of said two planar armatures, normal to said first scribing tracks in the same direction or in opposite directions, from a first position at the end of the associated said first scribing track up to, at a desired distance, second position at the start of said further scribing track;
moving said first planar armature, together with said laser device affixed thereto, along said planar stator at a constant rate in the direction opposite to the direction of creating said first scribing track, associated with said first planar armature, in order to create on said substrate said further scribing track, associated with said first planar armature by means of said laser beam generated by said laser device, and simultaneously moving said second planar armature, together with said second laser device affixed thereto, along said planar stator at the same rate as that of said first planar armature in the direction opposite to the direction of creating said further scribing track, associated with said first planar armature, in order to create on said substrate by means of said laser beam generated by said second laser device, said further scribing track, associated with said second planar armature; and
repeating the two preceding steps in order to create a desired number of said first scribing and further scribing tracks on said substrate.

18. The method according to claim 15 further comprising the steps of:
fitting said planar armature on said planar stator and moving said planar armature into a position, which corresponds to a start of a processing position on said substrate;
moving said planar armature, together with said laser device affixed thereto, along said planar stator on a chosen, freely-programmable trajectory at a freely-programmable rate in the first direction x or −x and at a further freely-programmable rate in the second direction y or −y, in such a manner that by means of said laser beam generated by said laser device to create forms selected from the group consisting of scribing tracks, cuts, bores, local heating, and engraving of a desired configuration;
moving said planar armature, after completing the processing in said first position on said substrate, together with said laser device affixed thereto, along said planar stator to a further processing position on said substrate; and
repeating the two preceding process steps in order to attain a desired number of processing positions on said substrate and to perform processing until said substrate has been processed to completion with the desired configurations.

19. A laser-scribing system for structuring substrates, said laser-scribing system comprising:
a platform accommodating at least one substrate;

at least one support body including at least one planar stator, said support body being fitted in a space-apart relationship to said platform;

at least one movable unit associated with said at least one support body, said movable unit including at least one planar armature configured to perform movements both in a first direction x and in a direction −x opposite to said first direction as well as in a second direction y, normal to said first direction x and in a direction −y opposite to said second direction y; and one or more laser devices with at least one laser beam are mounted on said planar armature, which creates scribing tracks on said substrate by said laser beam in the first direction x and in the direction −x opposite said first direction;

wherein said at least one planar armature with that parts of said laser devices, which are mounted on said planar armature have a mass added together that is smaller than a mass of said platform and said substrate added together;

wherein said laser devices further comprising at least one of:

a mounting device, at least one optical fiber, at least one collimating lens, at least one pair of deflecting mirrors, at least one focusing lens, and at least one laser source to generate said laser beam, wherein said at least one mounting device, said at least one collimating lens, said at least one pair of deflecting mirrors, and said at least one focusing lens are mounted on said planar armature, wherein said at least one laser source is stationary, and wherein said laser beam is guided from said stationary laser source to said planar armature via said optical fiber; and at least one solid state laser mounted on said planar armature.

* * * * *